(12) United States Patent
Zettner

(10) Patent No.: US 11,692,866 B2
(45) Date of Patent: Jul. 4, 2023

(54) SMART MOTOR DATA ANALYTICS WITH REAL-TIME ALGORITHM

(71) Applicant: Jürgen Zettner, Veitsbronn (DE)

(72) Inventor: Jürgen Zettner, Veitsbronn (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/768,973

(22) PCT Filed: Oct. 7, 2020

(86) PCT No.: PCT/EP2020/078110
§ 371 (c)(1),
(2) Date: Apr. 14, 2022

(87) PCT Pub. No.: WO2021/073976
PCT Pub. Date: Apr. 22, 2021

(65) Prior Publication Data
US 2022/0357194 A1 Nov. 10, 2022

(30) Foreign Application Priority Data

Oct. 16, 2019 (EP) .................................... 19203532

(51) Int. Cl.
*G01H 1/00* (2006.01)
*G01M 13/045* (2019.01)
(Continued)

(52) U.S. Cl.
CPC .......... *G01H 1/003* (2013.01); *G01M 13/045* (2013.01); *G01N 29/46* (2013.01); *G01R 23/167* (2013.01); *G06F 17/141* (2013.01)

(58) Field of Classification Search
CPC ..... G01H 1/003; G01M 13/045; G01N 29/46; G01R 23/167; G06F 17/141
See application file for complete search history.

(56) References Cited

U.S. PATENT DOCUMENTS

| | | | | |
|---|---|---|---|---|
| 7,308,322 B1 * | 12/2007 | Discenzo | ........... | G05B 23/0221 |
| | | | | 702/182 |
| 7,539,549 B1 * | 5/2009 | Discenzo | ............. | G05B 23/024 |
| | | | | 702/183 |

(Continued)

FOREIGN PATENT DOCUMENTS

| AU | 2017206138 A1 * | 2/2018 | | |
|---|---|---|---|---|
| EP | 1298511 A1 * | 4/2003 | ......... | F04D 15/0077 |

(Continued)

OTHER PUBLICATIONS

Banks, The Goertzel Algorithm, Embedded Systems Programming, (Year: 2002).*

(Continued)

*Primary Examiner* — David L Singer
(74) *Attorney, Agent, or Firm* — Lempia Summerfield Katz LLC

(57) ABSTRACT

A computer-implemented method and system for Condition Monitoring (CM) for rotating machines. The method and system include continuously receiving samples of the envelope of physical quantity data such as speed, vibration, or current, updating in real-time accumulator variables, computing in real-time spectral features based on the accumulator variables and supplemental variables, and determining a condition based on the real-time spectral features. The spectral features, exemplary as amplitudes at specific frequencies, are computed in real-time by a Goertzel Algorithm. The totality of the accumulator variables is sufficient to determine the condition of the rotating machine and the (Continued)

supplemental variables are temporarily needed for computing the spectral features. The one or more supplemental variables, such as memory addresses, are not based on the received samples of the input data.

8 Claims, 4 Drawing Sheets

(51) Int. Cl.
  *G01N 29/46* (2006.01)
  *G01R 23/167* (2006.01)
  *G06F 17/14* (2006.01)

(56) References Cited

U.S. PATENT DOCUMENTS

| | | | |
|---|---|---|---|
| 2005/0021580 A1* | 1/2005 | Swanson | G01R 23/167 708/405 |
| 2011/0285532 A1 | 11/2011 | Hedin | |
| 2017/0122230 A1* | 5/2017 | Bhattacharya | F02D 41/221 |
| 2017/0370803 A1* | 12/2017 | Moutsouriz | B65G 43/00 |
| 2018/0335366 A1 | 11/2018 | Qiao et al. | |
| 2019/0086241 A1* | 3/2019 | Joachimsthaler | G01D 5/24495 |
| 2019/0101436 A1 | 4/2019 | Li et al. | |
| 2019/0329610 A1* | 10/2019 | Hubert | G01M 13/045 |

FOREIGN PATENT DOCUMENTS

| | | |
|---|---|---|
| EP | 2175256 A2 | 4/2010 |
| EP | 2581725 A2 | 4/2013 |

OTHER PUBLICATIONS

Kiracofe, Enveloped FFT (Year: 2017).*
Karplus, Digital tone detection with Goertzel's algorithm (Year: 2017).*
Rick Lyons, Digital Envelope Detection: The Good, the Bad, and the Ugly, Digital Signal Processing Related, Web Page <https://www.dsprelated.com/showarticle/938.php> (Year: 2016).*
Timofiejczuk et al., Applied Condition Monitoring Advances in Condition Monitoring of Machinery in Non-Stationary Operations, pertinent pp. 21-32 article Estimation of Cyclic Cumulants of Machinery Vibration Signals in Non-stationary Operation by Roussel (Year: 2016).*
International Search Report and the Written Opinion for International Patent Application PCT/EP2020/078110 dated Feb. 4, 2021.

* cited by examiner

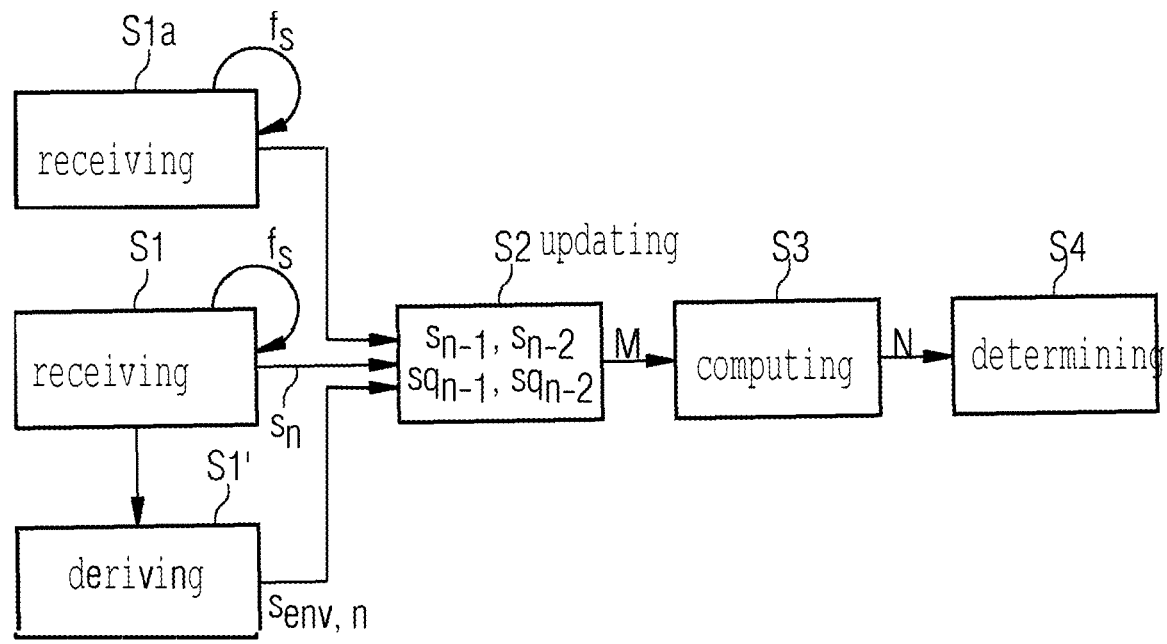
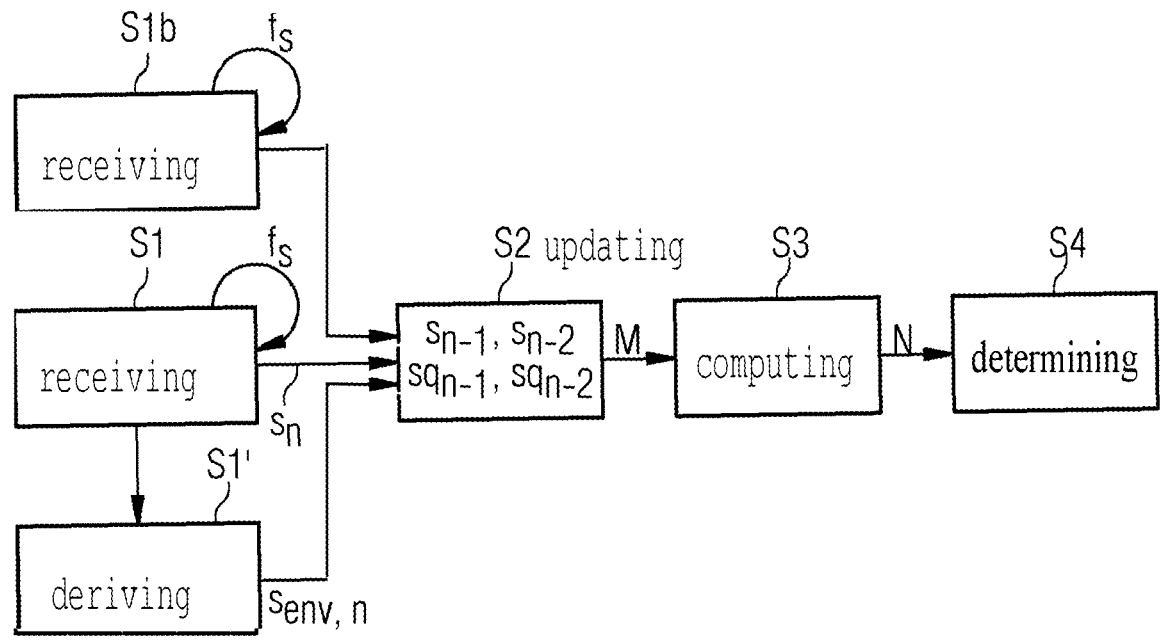

FIG 8
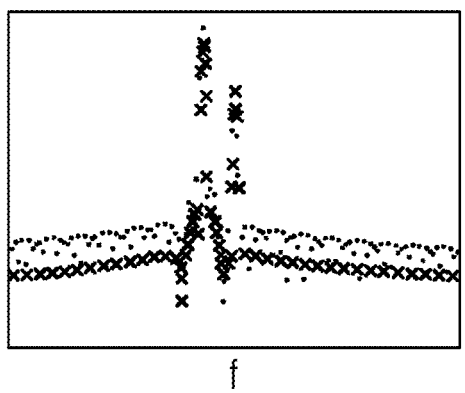
FFT spectrum (crosses) and real-time GA amplitudes for 65 frequencies (dots)
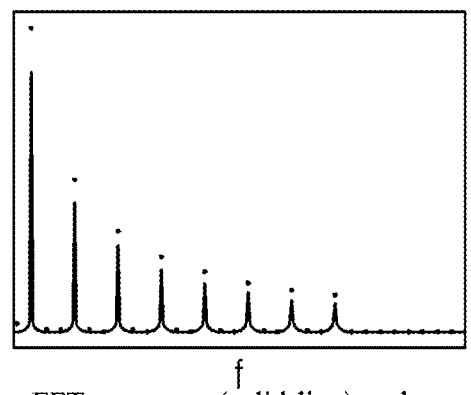
FFT spectrum (solid line) and real-time GA amplitudes for 7 the characteristic rotational speed and seven harmonics (dots) are depicted

SMART MOTOR DATA ANALYTICS WITH REAL-TIME ALGORITHM

CROSS REFERENCE TO RELATED APPLICATIONS

This present patent document is a § 371 nationalization of PCT Application Serial Number PCT/EP2020/078110 filed Oct. 7, 2020, designating the United States, which is hereby incorporated in its entirety by reference. This patent document also claims the benefit of EP19203532.7 filed on Oct. 16, 2019, which is hereby incorporated in its entirety by reference.

FIELD

Embodiments relate to a computer-implemented method of Condition Monitoring (CM) for rotating machines such as motors.

BACKGROUND

Failures of rotating machines (e.g., within bearings) for example by misalignment or imbalance of components of the rotating machine often lead to unplanned downtimes. Therefore, in the field of Condition Monitoring (CM), vibrational sensors that are attached to or aligned next to the rotating machines measure acceleration are used to derive measures for the state of the rotating machine as vibrations apply loads to all components especially the bearings of the rotating machine. Failure types like broken bars of a rotor of rotating machines, failure currents to earth or between windings of a stator and/or rotor of rotating machines, or eccentricities of rotating components of rotating machines are analysed by motor current signature analysis.

In CM, relevant damages may be determined using spectral information or rather spectral features of either the vibrational data or the current data measured at the rotating machine. Some features may be derived in time domain easily like e.g., the root mean square of velocity (compare to ISO10816) or acceleration levels or relative root mean square current values of each phase to a sum of currents. Further features derived from time domain are e.g., Max, Min, Crest-factor, or the like. Yet these time domain features don't allow for conclusion upon a specific fault or root cause. Therefore, experts regularly examine the condition of rotating machines like motors by measuring the vibration and calculating a velocity and envelope spectrum. Usually, CM diagnostics need a fixed rotational speed and/or load of the rotating machines for comparable diagnosis. The actual rotational speed is usually measured by a rotational speed sensor or encoder. Spectra then may be normalized towards the actual rotational speed. For example, in identifying bearing damage, imbalance, loose foots or other common fault state root causes the amplitudes of rotational frequency harmonic peaks and sidebands are used as indicators for the specific failures and their severity.

All known literature and algorithms for CM applications using vibrational sensors refer to acceleration and velocity spectra calculated via Fourier Transform (FT), for example via fast FT (FFT) and also refer to Envelope-Spectra, i.e., the spectral decomposition of the envelope of the raw signal as a mean of demodulation of impulse resonances of the localized bearing fault, being overrolled with each turn. Motor Current Signal Analysis (MCSA) algorithms in the electrical current domain use FFT and derive amplitudes at specific frequencies that are relied to slip, eccentricity, slot harmonics for applications with fixed rotational speed, like exemplarily in CM of induction motors or variable speed drives.

MCSA Signals are based on temporal measurements of the current of the electrical phases of a motor. Alternatively magnetic sensors may measure the magnetic flux in or outside a motor that are correlated to the currents. A simultaneous measurement of the voltages in the electrical phases is advantageous for detection of failures of the electrical machine with MCSA.

Traditional CM for diagnosis of fault conditions of rotating electrical machines (e.g. electrical faults) and bearings include of any combination of processing blocks from signal sampling, pre-processing, feature extraction, and classification. For expert systems at least the spectra are generated in a CM System to be used as the base of an expert's decision. Another implementation depth may involve the output of the CM quantities (or features) i.e., the amplitudes at frequencies characteristic of certain defects, fault states either of the drive train, an asset or the bearing, and the like. In more advanced CM systems, a classification step at least decides based upon one spectral feature which fault is present and in what severity level, so that recommendations for further steps may be produced.

Clearly with more output depth i.e., more blocks that are implemented in a CM system, the workload of the main processor unit raises.

For CM vibrational measurements and the calculation of the spectra there is usually a high amount of signal bandwidth involved (e.g., sampling rates of 6.6 kHz [Kilohertz] to 48 kHz or even more for common Micro-Electro-Mechanical System (MEMS) vibrational sensors like piezoelectrical sensors using 16 bit data depth of each sample). Current and/or voltage sampling are performed typically in the lower kHz region (e.g. 3200 Hz [Hertz] for a Simocode Datalogger, where typically three electrical phases are measured with 12 bit data depth, resulting in a data stream of 6×3.2 KHz @ 12 bit).

Measurement times of ca. 0.1 to 20 s [Second] are used and necessary for FFT, due to the frequency resolution of roundabout 0.1 to 1 Hz and lowest frequency of e.g. 1 to 10 Hz. Usually, three axis or electrical phases are sampled. Therefore, for calculation of the spectra a high amount of memory and thus a huge data storage is needed in hardware intended for performing CM tasks, whilst the amount to time to perform the calculation of the spectra is not that important. High amount of memory, for example, from 51 kB [Kilobyte] (6600/s*16 bit*0.5 s) to 7 MB [Megabyte] (24000/s*16 bit*20 s) for each measurement axis, whereby sample length determines lowest possible frequency and resolution. For rotating equipment a minimum of 5 to 10 rotations per measurement should be taken to get stable amplitudes in the spectra.

The typical measurements in CM need several megabytes of high-resolution input data (e.g., vibrational data), mostly to be able to measure at the "lowest rotational speed" of an application. Therefore, the number of samples L needed is very high. For example, in hardware architectures of vibrational CM systems the vibrational data sampled is either stored locally and then communicated or streamed to a device or into a cloud, where the spectra and spectral features derived from them, are then calculated. Therefore, all known solutions require high performance Central Processing Units (CPU) to perform the analysis. Microcontrollers for calculation of spectral information close to sensor acquisition devices and on a low-cost base (IQ Connect), nowadays offer several 10 MB to 100 MB of Random Access Memory (RAM). In common CM systems a reduction in sample length or data acquisition rate or the amount of axes is possible and spectral information still may be calculated, but inevitably with reduced information output.

Consequently, in the known state of the art there is no low-cost hardware described, for performing CM based on spectral features with sufficient spectral information.

The document EP 2 581 725 A2 discloses a system capable of automatically detecting a rolling-element bearing fault in a rotating machine. The system receives, from at least one sensor, a sensor signal that includes at least one frequency and converts the sensor signal to a digital vibration signal. The system modifies the vibration signal to generate an envelope signal and applies a transform to the enveloped signal to generate an envelope spectrum. The system uses certain relationships among envelope spectral line amplitudes and their harmonics to detect bearing faults. As such, the system detects a bearing fault without reference to predefined fault frequencies.

BRIEF SUMMARY AND DESCRIPTION

The scope of the present invention is defined solely by the appended claims and is not affected to any degree by the statements within this summary. The present embodiments may obviate one or more of the drawbacks or limitations in the related art.

Embodiments provide a computer-implemented method of Condition Monitoring (CM) for rotating machines including the steps of continuously receiving samples, updating in real-time M accumulator variables, computing in real-time N spectral features, and determining a condition. In the step of continuously receiving samples of input data, samples of input data based on at least one physical quantity over time of a rotating machine are received. In the step of updating in real-time M accumulator variables, M accumulator variables are updated in real-time based on L samples. Thereby M is greater than or equal to one (M>=1). The L samples include a current sample $s_n$ and at least one preceding sample $s_{n-1}$ of the input data. In the step of computing in real-time N spectral features, N features are computed in real-time based on the M accumulator variables and m supplemental variables. Thereby, N is greater than or equal to one (N>=1) and m is greater than or equal to one (m>=1). In the step of determining a condition, a condition of the rotating machine is determined based on the N spectral features. Further, the M accumulator variables are updated in real-time based on the L samples and/or $L_{env}$ samples including the current sample $s_n$ and/or $senv_n$ a first preceding sample $s_{n-1}$ and/or $senv_{n-1}$ and a second preceding sample $s_{n-2}$ and/or $senv_{n-2}$ of the input data and/or of the envelope and the N spectral features are computed in real-time by the Goertzel Algorithm, GA. Herein, the totality of the M accumulator variables is sufficient to determine the condition of the rotating machine. Further, the m supplemental variables are temporarily needed for computing the N spectral features and the m supplemental variables are not based on the received samples of the input data.

Embodiments provide a computer program includes instructions that, when the program is executed by a computer, cause the computer to carry out the steps of the method.

Embodiments provide a computer-readable medium has stored thereon the computer program.

Embodiments provide a data processing system for CM for rotating machines includes an interface and computer. The interface is configured to receive samples of input data based on at least one physical quantity over time of a rotating machine. The computer are configured to carry out the steps of the method.

Embodiments provide a system includes a rotating machine, at least one sensor and a data processing system. The at least one sensor is configured to measure at least one physical quantity over time of the rotating machine. The data processing system is a data processing system. The data processing system is communicatively connected to the at least one sensor. The at least sensor is further configured to provide the measured at least one physical quantity as samples of input data to the data processing system.

The rotating machine may be any rotating machine like a motor, a generator, a turbine, and the like. For example, the rotating machine may be an electrical motor including a stator and a rotor, where the rotor may be pivoted via bearings in a housing of the electrical motor. The electrical motor is powered with electrical energy by an electrical current, for example, an alternating current (AC) including an amperage and voltage with certain amplitudes and frequencies. The bearing may be a ball bearing, a cone bearing, a roller bearing, etc. and the bearing may pivot the rotor at two points. The torque generated by the electrical motor may be provided via a shaft of the electrical motor that is fixedly connected to the pivoted rotor.

The at least one physical quantity of the rotating machine that is observed over time may be any physical quantity that provides information about the condition or state of the rotating machine-like vibrations, the electrical current provided to the rotating machine (e.g., the electrical motor), or any other periodically occurring physical quantity.

The at least one physical quantity is monitored by the at least one sensor. Thereto, the sensor measures directly or indirectly the respective physical quantity and converts the measurements into the input data, for example into an (analogue) electrical amperage and/or voltage that may be sampled and converted into a digital input signal with a certain clock rate or sample frequency $f_s$ by an analogue to digital (A/D) converter. The A/D converter may be part of the sensor or of the data processing unit. The (digital) input signal is provided in consecutive samples at the certain clock rate, where each sample gives a quantitative value of the monitored physical quantity at a certain time point or rather interval. The clock rate, for example the interval, may be predetermined or adjusted as needed.

The interface of the data processing system may be any communicative interface. The interface may be cable-based like a USB-interface, a COM-interface, a RS32-interface etc. or wire-less like a Bluetooth-interface, a ZigBee-interface, a WLAN-interface etc. Via the interface the input data is provided sample by sample to the computer of the data processing system.

The input data is continuously received, for example at the interface of the data processing system. Thereby, the input data is received sample by sample at the certain clock rate. Each received sample of the input data encodes a quantitative value of the respective at least one physical quantity of the rotating machine.

The M accumulator variables are a set of predefined variables that are used to compute the N spectral features. The M accumulator variables are based on L samples. The L samples include the current sample $s_n$, that was last received, and the at least one preceding sample $s_{n-1}$, that was received one time step of the clock rate before the current sample $s_n$. When more than one physical quantity is monitored, for example two vibrations and one electrical current of the rotating machine, then the M accumulator variables are based on the L samples, where the L samples include the current samples $s_{x,n}$ and at least one preceding sample $s_{x,n-1}$ of each monitored physical quantity, for example $s_{v1,n}$ and $s_{v1,n-1}$ of the first monitored vibration, $s_{v2,n}$ and $s_{v2,n-1}$ of the second monitored vibration and $s_{e,n}$ and $s_{e,n-1}$ of the monitored electrical current. The M accumulator variables are updated in real-time, such that the M accumulator variables are updated before the next sample of the input data is received. After the L samples have been received, i.e. the current sample(s) $s_{(x,)n}$ and the at least one preceding sample(s) $s_{(x,)n-1}$ of the input data based on the at least one (more than one) physical quantity measured at the rotating machine, and the M accumulator variables are correspondingly updated, the M accumulator variables each hold a valid, stable, significant feature value, whereby the totality of the M accumulator variables is sufficient to determine the condition of the rotating machine.

After the M accumulator variables are updated, the N spectral features are computed based on the updated M accumulator variables and the m supplemental variables. Thereby, the N spectral features are computed in real-time, such that the N spectral features are computed before the next sample of the input data is received. The number of spectral features N may be greater than the number of accumulator variables M (N>M) and for example, the number of spectral features N may be significantly greater than the number of accumulator variables (N>>M, e.g., by one order of magnitude greater).

The m supplemental variables may be predefined like variables (e.g., memory addresses) temporarily needed in computing the N spectral features, but the m supplemental variables are not based on the received samples of the input data. For example, the m supplemental variables are temporarily needed for computing the N spectral features.

Based on the computed N spectral features, the condition of the rotating machine may be derived. The condition of the rotating machine may be automatically derived, for example by a trained neural network, by a decision tree and the like.

Embodiments do not rely on classical approaches like Fourier Transformation (FT) that is processing many samples of a long period of time (e.g., 1 s [Second] or longer) in one calculation step and therefore needs a large amount of memory for the many samples (e.g., from about 51 kB to about 7 MB). Instead, embodiments avoid a large amount of memory by processing every single data sample acquired from the rotating machine into the M accumulator variables in real-time and using only the M accumulator variables together with the m supplemental variables to establish the valid, stable significant N spectral features, by applying a combination of real-time algorithms. Thus, the data processing systems on which the N spectral features are computed in real-time only need a very small amount of memory. This reduces the cost of these data processing systems.

The M accumulator variables are updated in real-time based on the L samples and/or $L_{env}$ samples including the current sample $s_n$ and/or $s_{env,n}$, a first preceding sample $s_{n-1}$ and/or $s_{env,n-1}$ and a second preceding sample $s_{n-2}$ and/or $s_{env,n-2}$ of the input data and/or of the envelope and the N spectral features are computed in real-time by the Goertzel Algorithm (GA).

As real-time amplitude estimation algorithm the GA is used. Like the Discrete Fourier Transform (DFT), GA analyses one selectable frequency component from a discrete signal, here the samples of the input data. However, unlike the DFT the GA applies a single real-valued coefficient at each iteration, using real-valued arithmetic for real-valued input sequences. For computing a small number of selected frequency components, the GA is more numerically efficient than the DFT. The simple structure of the GA makes it well suited to small processors and embedded applications. A main calculation in the GA has the form of a digital filter operating on an input, here the current sample $s_n$ in a cascade of two stages with a parameter $\omega_0$ giving the frequency under investigation (normalised to radians per sample). At a first stage of the GA an intermediate sequence $sq_n$ (sq[n]) is computed:

$$sq[n]=s[n]+2\cos(\omega_0)sq[n-1]-sq[n-2]$$

At the second stage, the following filter is applied to the intermediate sequence $sq_n$ to produce the output, here the respective accumulator variable $y_n$ (y[n]):

$$y[n]=sq[n]-e^{-j\omega_0}sq[n-1]$$

The first stage corresponds to a second order IIR filter with a direct-form structure, where its internal state variables equal the past output values from that stage. Input values, here the current samples $s_n$ for n smaller than zero (n<0) are presumed all equal to zero ($s_{n<0}=0$). To establish the initial filter state so that evaluation may begin at the sample $s_0$, the filter states are assigned initial values for the intermediate state ($s_{-2}=s_{-1}=0$). To avoid aliasing hazards, the frequency under investigation $\omega_0$ may be restricted to the range of zero to $\pi$ according to the Nyquist-Shannon sampling theorem ($0<\omega_0<=\pi$).

The second-stage filter may be observed to be a FIR filter, since its calculations do not use any of its past outputs.

In the following an implementation of the GA is given in pseudo code. It may be seen, that for a frequency under investigation $\omega_0$ ("freq" in pseudo code) only the current sample $s_n$ ("sample" in pseudo code) and the two previous samples $s_{n-1}$, $s_{n-2}$ or rather the two previous intermediate sequences $sq_{n-1}$, $sq_{n-2}$ ("sprev", "sprev2" in pseudo code) are needed as the M accumulator variables to update one of the N spectral features, here the amplitude ("amplitude" in pseudo code) of the frequency under investigation $\omega_0$ ("freq") in the input data. Additionally, one coefficient ("coeff" in pseudo code), which coefficient may be pre-calculated in a table, in order to avoid a time-consuming cos-function call, and where coeff is a time independent weighting factor, simply, between actual and previous samples, the sampling frequency $f_s$ ("fs" in pseudo code) and the frequency under investigation $\omega_0$ ("freq") are needed as supplemental variables besides the M accumulator variables.

```
def RTgoertzelFilter(sample, freq, fs, N):
  global sprev;
  global sprev2;
  global totalpower;
  normalizedfreq=freq/fs;
  coeff=2*cos(2*π*normalizedfreq);
  sample+=coeff*sprev-sprev2; 'first stage
  sprev2=sprev;
  sprev=sample;
  power=sprev2*sprev2+sprev*sprev-coeff*sprev*sprev2; 'second stage
  totalpower+=sample*sample;
  amplitude=(power/totalpower)**0.5
  return amplitude;
end def
```

Using multiple frequencies under investigation $\omega_0$ one may either build a spectrum with any desired resolution or estimate exactly at the frequencies that are e.g., harmonics of a rotational speed of the rotating machine.

Considering the above it is clear, that the real-time GA only needs the M accumulators plus some additional minor m supplemental variables (i.e., coefficients, internal storage addresses etc.) to calculate the amplitudes at multiple frequencies under investigation $\omega_0$. For example, ten rotational harmonic frequencies are typically investigated.

The same GA may also be applied for one or multiple frequencies under investigation to derive amplitudes in the envelope (based on the $L_{env}$ samples of the envelope). The amplitudes for the one/multiple frequencies under investigation are derived as spectral features for example at the pass frequencies of an inner ring ($f_{ir}$), an outer ring ($f_{or}$), a cage ($f_{cg}$) and bearing balls ($f_{bl}$), their kth-higher harmonics ($k_{xfir}$, $k_{xfor}$, ... ) and also sidebands (mostly at $k*f_{ir}+/-p*f_{rot}$, with k, p∈(1, 10)) for a bearing of the rotating machine. When deriving the envelope in real-time, the amplitudes of the pass frequencies, their harmonics and sidebands may be determined using the real time GA as described before.

The GA is a fast algorithm that needs very little memory for calculating the N spectral features used in CM.

In an embodiment, the method further includes the step of deriving in-real time samples. In the step of deriving in-real time samples, samples of an envelope of the input data are derived in real-time based on the samples of the input data, for example, by a rectification followed by a lowpass filtering or by an asynchronous complex IQ envelope detector and, for example, by a biquad filter approach. The M accumulator variables are additionally or alternatively updated based on $L_{env}$ samples including a current sample $n_{env}$ and at least one preceding sample $n_{env}-1$ of the envelope.

In CM for bearing fault detection the acceleration signals are investigated in an envelope spectrum. Reason being that the bearing faults are introducing sequences of periodic spikes and get modulated by some resonances in the system. Therefore, the envelope of the input data is needed. Only algorithms feasible to be calculated in real-time are useful for building the envelope to ensure the overall real-time processing. For example, a current sample of the envelope has to be derived from the current received sample before the next sample of the input data is received.

A simple rectification followed by a lowpass filter may be implemented as a real-time algorithm for building the envelope of the input data. Such an asynchronous real square law envelope detector may be build using a real time lowpass filter (e.g., biquad filter approaches) after squaring of each sample n of the input data. For example, biquad filter approaches are common in digital signal processing and the most straightforward implementation is the so called "direct form 1", that has the following difference equation if normalized:

$$s_{env}[n]=b_0 s[n]+b_1 s[n-1]+b_2 s[n-2]-a_1 s[n-1]-a_2 s[n-2]$$

where the coefficients $b_0$, $b_1$, $b_2$ determine zeros, and the coefficients $a_1$, $a_2$, determine the position of the poles of the corresponding transfer function composed of two quadratic polynomials. Here the coefficients $b_0$, $b_1$, $b_2$, $a_1$, $a_2$ are included in the supplemental variables m. ($s_n$ corresponds to $s[n]$ and $s_{env,n}$ corresponds to $s_{env}[n]$ and so forth).

Alternatively, also suitable is multiplication of the input data by sine (In phase—I) and cosine (Quadrature—Q), where ω is the carrier frequency. This is called an asynchronous complex IQ envelope detector, where a real time multiplication of the input data by sine and cosine coefficients having (roundabout or exact) the same frequency ω as the carrier frequency ω.

Both methods mentioned above may be calculated in real-time. In the algorithms only the current sample $s_n$ of the current time step n and two previous samples $s_{n-1}$ and $s_{n-2}$ of the time steps n–1 and n–2, as well as the pre-calculated coefficients are necessary to filter in real-time.

The M accumulator variables are additionally or alternatively updated based on the $L_{env}$ samples that include the current sample $s_{env,n}(s_{env}[n])$ and the at least one preceding sample $s_{env,n-1}(s_{env}[n-1])$ of the envelope. Consequently, the N spectral features are computed based on the M accumulator variables that are additionally or alternatively based on the $L_{env}$ samples of the envelope.

The real-time deriving of the envelope of the input data enables extraction of further information for CM, for example for bearing fault detection, while only a small amount of memory needed for the $L_{env}$ samples of the envelope.

In an embodiment, the input data includes vibrational data based on a vibration over time of the rotating machine and/or electrical data based on an electrical current and/or voltage over time provided to the rotating machine.

In an embodiment, the interface includes a first interface and/or a second interface. The first interface is configured to receive samples of vibrational data based on a vibration over time of the rotating machine. The second interface is configured to receive samples of electrical data based on an electrical current over time provided to the rotating machine.

According to a further refinement the at least one sensor is a vibrational sensor and additionally or alternatively an electrical sensor. The vibrational sensor is configured to measure a vibration over time of the rotating machine and to provide the measured vibration as samples of vibrational data to the data processing system. The electrical sensor is configured to measure an electrical current (amperage) and/or voltage and/or magnetic field over time provided to the rotating machine and to provide the measured electrical current (amperage) and/or voltage as samples of electrical data to the data processing system.

For example, vibrations of the rotating machine may be measured by the vibrational sensor that may be based on the Piezo-electric effect. Thereby, the vibrations are converted into a voltage that is generated due to the vibrations by the vibrational sensor. The amplitude and frequency of the generated voltage resemble the vibrations measured at the rotating machine. The continuous (analogue) periodical voltage may then be sampled into consecutive samples with the certain clock rate or sampling frequency $f_s$ by an A/D converter. Each sample gives an amplitude of the voltage at the respective time point.

The samples provided by the vibrational sensor are received at the first interface of the data processing system and forwarded to the computer.

For example, the electrical current provided to the rotating machine (e.g., electrical motor) may be measured by the electrical sensor that may be an electrical current (amperage) sensor or a voltage detector. Thereby, the time course of the provided electrical current is converted into a proportional signal that is generated due to the amplitude of the electrical current by the electrical sensor (e.g. a Hall effect sensor, a transformer/current clamp meter, a fluxgate transformer type sensor, a resistor, whose voltage is directly proportional to the current through it, a fibre optic current sensor, using an interferometer to measure the phase change in the light produced by a magnetic field, a Rogowski coil, etc.). The amplitude and frequency of the generated signal (voltage) resemble the electrical current measured at the rotating machine. The continuous (analogue) periodical signal may then be sampled into consecutive samples with the certain clock rate or sampling frequency $f_s$ by an A/D converter. Each sample gives an amplitude of the signal at the respective time point.

The samples provided by the electrical sensor are received at the second interface of the data processing system and forwarded to the computer.

For example, in CM the following types of condition/state/failure and the spectral features used to identify them are given:

unbalance rotation frequency $f_n$ as RMS [Root Mean Square]
misalignment/ single $f_n$ as RMS/
coupling defect double $f_n$ as RMS
mounting defect single $f_n$ as RMS/
double $f_n$ as RMS/
triple $f_n$ as RMS
blade passing frequency $f_{SP}$ as RMS
(e.g. of turbine)
meshing defect $f_Z$
(e.g. of gear)
belt defect $f_R$ as RMS
resonance resonance frequency=$f_n$ as RMS
bearing wear $f_{LE}$ as DKW (Diagnosekennwert, german for diagnosis characteristic value, a value with respect to a historical recorded state)
bearing damage frequency envelope curve, geometry dependent for outer ring inner ring, cage and rolling element of bearing as DKW
electrical stator fault double line frequency $f_{line}$ as RMS
electrical rotor fault $f_{bar}$ as RMS
rotor bar break $f_{line}$ and modulation with slip frequency $f_{slip}$ as RMS With the vibrational data and/or the electrical data as input data, many different conditions of the rotating machine may be reliably determined.

In an embodiment the method further includes the step continuously receiving at least one characteristic rotational speed or determining in real-time the at least one characteristic rotational speed. In the step of continuously receiving at least one characteristic rotational speed, at least one characteristic rotational speed of the rotating machine is continuously received. In the step of determining in real-time the at least one characteristic rotational speed, the at least one characteristic rotational speed of the rotating machine is determined in real-time based on the vibrational data by a real-time Frequency Locked Loop, FLL, method. The M accumulator variables are updated based additionally on the rotational speed or harmonics thereof.

The characteristic rotational speed of the rotating machine may be measured by a rotational speed sensor at the rotating machine. The measured characteristic rotational speed may be provided to the data processing system at a third interface from where it is forwarded to the computer.

Alternatively, or additionally, the real-time FLL may be used in combination with the vibrational data, for estimating the most correct frequency as characteristic rotational speed of the rotating machine. A corresponding FFL-analyser includes an oscillator, a mixer, and an analysing block. The oscillator generates a digital oscillating signal S' having an oscillating frequency f'. The mixer is provided with the digital oscillating signal S' and the samples of the vibrational data and generates a mixed signal S" therefrom. The mixed signal S" includes a first signal part of a sum signal of the frequency of the vibrational signal and the oscillating frequency f' as well as a second signal part of a difference signal of the frequency of the vibrational signal and the oscillating frequency f'. The analysing block updates the oscillating frequency f' based on the second signal part including the difference of the frequency of the vibrational signal and the oscillating frequency f' such that the oscillating frequency f' is adjusted to the frequency of the vibrational signal, i.e., FLL (frequency locked loop).

Additionally, to the characteristic rotational speed, harmonics of the characteristic rotational speed may be calculated and used as further accumulator variables.

The measured or determined (estimated) characteristic rotational speed may be used as the frequency under investigation $\omega_0$ or as one of the frequencies under investigation $\omega_0$, to ensure that also for higher harmonics, where an error in e.g., the $f_{rot}$ estimation or measurement is higher with higher k (also valid for p for the sideband calculation) is corrected and the amplitude is determined (e.g. via the GA) at the best frequency approximate possible.

In an embodiment the N spectral features include at least one amplitude of at least one first frequency under investigation $\omega_0$, when the M accumulator variables include the at least one first frequency under investigation $\omega_0$ and/or at least one amplitude of at least one second frequency under investigation $\omega_{0,env}$ in the envelope, when the M accumulator variables include the at least one second frequency under investigation $\omega_{0,env}$.

For example, based on the GA, the amplitude of the at least one first frequency under investigation $\omega_0$ may be calculated as one of the N spectral features of the input data (e.g., vibrational data and/or electrical data) in real-time. Also the amplitude of the at least one second frequency under investigation $\omega_{0,env}$ may be calculated as one of the N spectral features of the envelope (e.g. envelope of the vibrational data and/or electrical data) in real-time.

Embodiments and its technical field are subsequently explained in further detail by exemplary embodiments shown in the drawings. The exemplary embodiments only conduce better understanding and in no case are to be construed as limiting for the scope of the described embodiments. For example, it is possible to extract aspects of the subject-matter described in the figures and to combine it with other components and findings of the present description or figures, if not explicitly described differently. Equal reference signs refer to the same objects, such that explanations from other figures may be supplementally used.

BRIEF DESCRIPTION OF THE FIGURES

FIG. 1 depicts a schematic flow chart of an embodiment of the computer-implemented method of CM for rotating machines.

FIG. 2 depicts a schematic flow chart of a further embodiment of the computer-implemented method of CM for rotating machines.

FIG. 8 depicts two diagrams comparing the output of a FFT with the output of the GA according to an embodiment.

DETAILED DESCRIPTION

Figure 3:
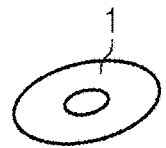
FIG. 3 depicts a schematic view of an embodiment of the computer-readable medium.

In FIG. 1 an embodiment of the computer-implemented method of CM for rotating machines is schematically depicted. The method includes the steps continuously receiving S1 samples of input data, continuously receiving S1a at least one characteristic rotational speed, deriving S1' in-real time samples of an envelope, updating S2 in real-time M accumulator variables, computing S3 in real-time N spectral features and determining S4 a condition.

In the step of continuously receiving S1 samples of input data, samples of input data, for example of vibrational data and electrical data, are continuously received with a predetermined sampling frequency $f_s$. The input data is based on two physical quantities, for example the vibrational data is based on a vibration at a bearing of a rotating machine and the electrical data is based on an electrical current provided to the electrical machine. The input data is provided by respective sensors, for example the vibrational data is provided by a vibrational sensor measuring the vibrations at the bearing of the rotating machine the electrical data is provided by an electrical sensor measuring the electrical current provided to the electrical machine. The input data, i.e., the vibrational data and electrical data are each received as consecutive samples, hence as digital signals.

In the step of continuously receiving S1a at least one characteristic rotational speed, a characteristic rotational speed of the rotating machine is continuously received with the predetermined sampling frequency $f_s$. The characteristic rotational speed is provided by a rotational speed sensor measuring the current rotational speed of a shaft of the rotating machine. The characteristic rotational speed is received as digital signal, i.e., in consecutive samples.

In the step of deriving S1' in-real time samples of an envelope, samples of an envelope are derived from the samples of the input data, i.e. samples of an envelope of the vibrational data and samples of an envelope of the electrical data are derived. The samples of the two envelopes are derived either by an asynchronous real square law envelope detector 30 (cf. FIG. 6) or by an asynchronous complex IQ envelope detector 40 (cf. FIG. 7).

The steps of updating S2 in real-time M accumulator variables and computing S3 in real-time N spectral features are based on the Goertzel Algorithm (GA).

In the step of updating S2 in real-time M accumulator variables, M accumulator variables are updated in real-time based on L samples. Here, M=8 accumulator variables include the current samples of the input data, for example of the vibrational data and the electrical data as well as the current samples of the envelopes of the vibrational data and the electrical data. Further, the M accumulator variables include two previous intermediate sequences $sq_{n-1}$, $sq_{n-2}$ of the vibrational data and the electrical data as well as of the envelopes of the vibrational data and the electrical data. For example, the M accumulator variables correspond to the L samples. The L samples include a current sample of the vibrational data $s_{v,n}$ and a current sample of the electrical data $s_{e,n}$ as well as a current sample of the envelope of the vibrational data $s_{v,env,n}$ and a current sample of the envelope of the electrical data $s_{e,env,n}$. Further, the L samples include a first preceding sample of the vibrational data $s_{v,n-1}$ and a first preceding sample of the electrical data $s_{e,n-1}$ as well as a first preceding sample of the envelope of the vibrational data $s_{v,env,n-1}$ and a first preceding sample of the electrical data $s_{e,env,n-1}$. Additionally, the L samples include a second preceding sample of the vibrational data $s_{v,n-2}$ and a second preceding sample of the electrical data $s_{e,n-2}$ as well as a second preceding sample of the envelope of the vibrational data $s_{v,env,n-2}$ and a second preceding sample of the envelope of the electrical data $s_{e,env,n-2}$. Here, the first and second preceding samples $s_{v,n-1}$, $s_{e,n-1}$, $s_{v,env,n-1}$, $s_{e,env,n-1}$, $s_{v,n-2}$, $s_{e,n-2}$, $s_{v,env,n-2}$, $s_{e,env,n-2}$ are replaced by the corresponding intermediate sequences $sq_{v,n-1}$, $sq_{e,n-1}$, $sq_{v,env,n-1}$, $sq_{e,env,n-1}$, $sq_{v,n-2}$, $sq_{e,n-2}$, $sq_{v,env,n-2}$, $sq_{e,env,n-2}$ in the M accumulator variables, where the first and second intermediate sequences have been calculated based on the respective first and second preceding samples.

In the step of computing S3 in real-time N spectral features, the N spectral features are computed in real-time based on the M=8 accumulator variables. Here N=40 amplitudes of ten first frequencies under investigation $\omega_{0,v,1}$ to $\omega_{0,v,10}$ in the vibrational data, ten first frequencies under investigation $\omega_{0,e,1}$ to $\omega_{0,e,10}$ in the electrical data, ten second frequencies under investigation $\omega_{0,env,v,1}$ to $\omega_{0,env,v,10}$ in the envelope of the vibrational data and ten second frequencies under investigation $\omega_{0,env,v,1}$ to $\omega_{0,env,v,10}$ in the envelope of the vibrational data are computed in real-time with the GA.

In the step of determining S4 a condition, a condition of the rotating machine is derived based on the N=40 calculated amplitudes.

In FIG. 2 a further embodiment of the computer-implemented method of CM for rotating machines is schematically depicted. The method includes the same steps like the method of FIG. 1 except that instead of the step S1a the step of determining S1b in real-time the at least one characteristic rotational speed is included by the method of FIG. 2. Therefore, only the difference between the two embodiments of FIG. 1 and FIG. 2, for example the step S1b, is described in the following.

In the step of determining S1b in real-time the at least one characteristic rotational speed, the at least one characteristic rotational speed of the rotating machine is determined in real-time based on the vibrational data by a real-time Frequency Locked Loop (FLL) method. For example, a FFL-analyser (not depicted) is used for determining the characteristic rotational speed in real-time. The FFL-analyser includes an oscillator, a mixer and an analysing block. The oscillator generates a digital oscillating signal S' having an oscillating frequency f'. The mixer is provided with the digital oscillating signal S' and the samples of the vibrational data and generates a mixed signal S" therefrom. The mixed signal S" includes a first signal part of a sum signal of the frequency of the vibrational signal and the oscillating frequency f' as well as a second signal part of a difference signal of the frequency of the vibrational signal and the oscillating frequency f'. The analysing block updates the oscillating frequency f' based on the second signal part including the difference of the frequency of the vibrational signal and the oscillating frequency f' such that the oscillating frequency f' is adjusted to the frequency of the vibrational signal.

The program steps of the computer program correspond to the method steps of the method described above and as depicted in FIGS. 1 to 2.

In FIG. 3 an embodiment of the computer-readable medium 1 is schematically depicted.

Here, a computer-readable storage disc 1 like a Compact Disc (CD), Digital Video Disc (DVD), High Definition DVD (HD DVD) or Blu-ray Disc (BD) has stored there on the computer program and as schematically shown in FIGS.

1 to 2. However, the computer-readable medium may also be a data storage like a magnetic storage/memory (e.g. magnetic-core memory, magnetic tape, magnetic card, magnet strip, magnet bubble storage, drum storage, hard disc drive, floppy disc or removable storage), an optical storage/memory (e.g. holographic memory, optical tape, Tesa tape, Laserdisc, Phasewriter (Phasewriter Dual, PD) or Ultra Density Optical (UDO)), a magneto-optical storage/memory (e.g. MiniDisc or Magneto-Optical Disk (MO-Disk)), a volatile semiconductor/solid state memory (e.g. Random Access Memory (RAM), Dynamic RAM (DRAM) or Static RAM (SRAM)), a non-volatile semiconductor/solid state memory (e.g. Read Only Memory (ROM), Programmable ROM (PROM), Erasable PROM (EPROM), Electrically EPROM (EEPROM), Flash-EEPROM (e.g. USB-Stick), Ferroelectric RAM (FRAM), Magnetoresistive RAM (MRAM) or Phase-change RAM).

Figure 4:
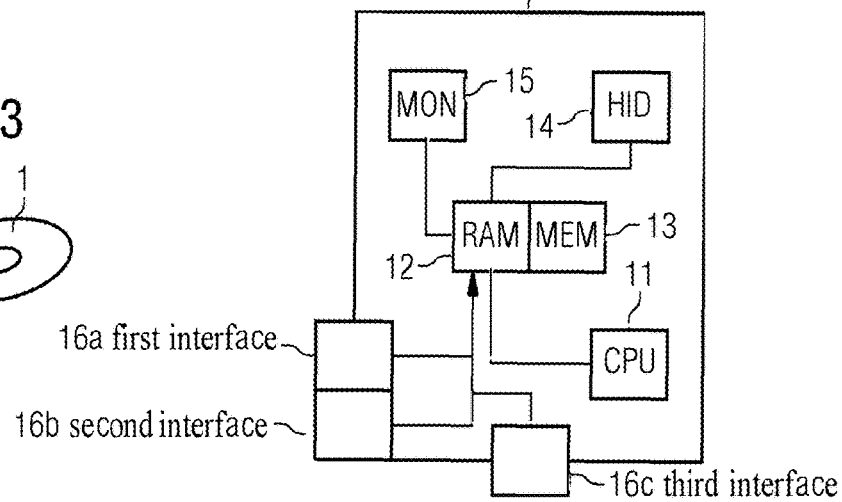
FIG. 4 depicts a schematic view of the data processing system for CM for rotating machines according to an embodiment.

In FIG. 4 an embodiment of the data processing system 10 is schematically depicted.

The data processing system 10 may be a personal computer (PC), a laptop, a tablet, a server, a distributed system (e.g., cloud system) and the like. The data processing system 10 includes a central processing unit (CPU) 11, a memory having a random-access memory (RAM) 12 and a non-volatile memory (MEM, e.g., hard disk) 13, a human interface device (HID, e.g., keyboard, mouse, touchscreen etc.) 14 and an output device (MON, e.g., monitor, printer, speaker, etc.) 15. Further, the data processing system 10 includes a first interface 16a, a second interface 16b and a third interface 16c. The CPU 11, RAM 12, HID 14, MON 15 and the three interfaces 16a, 16b, 16c are communicatively connected via a data bus. The RAM 12 and MEM 13 are communicatively connected via another data bus. The computer program schematically depicted in FIGS. 1 to 2 may be loaded into the RAM 12 from the MEM 13 or another computer-readable medium 1. According to the computer program the vibrational data from the vibrational sensor is received at the first interface 16a and the electrical data from the electrical sensor is received at the second interface 16b. At the third interface 16c the characteristic rotational speed of the rotating machine is received from the rotational speed sensor. Further, the CPU 11 executes the steps of the computer-implemented method and as schematically depicted in FIGS. 1 to 2. The execution may be initiated and controlled by a user via the HID 14. The status and/or result of the executed computer program may be indicated to the user by the MON 15. The result of the executed computer program may be permanently stored on the non-volatile MEM 13 or another computer-readable medium.

The HID 14 and MON 15 for controlling execution of the computer program may be included by a different data processing system like a terminal communicatively connected to the data processing system 10 (e.g., cloud system).

Figure 5:
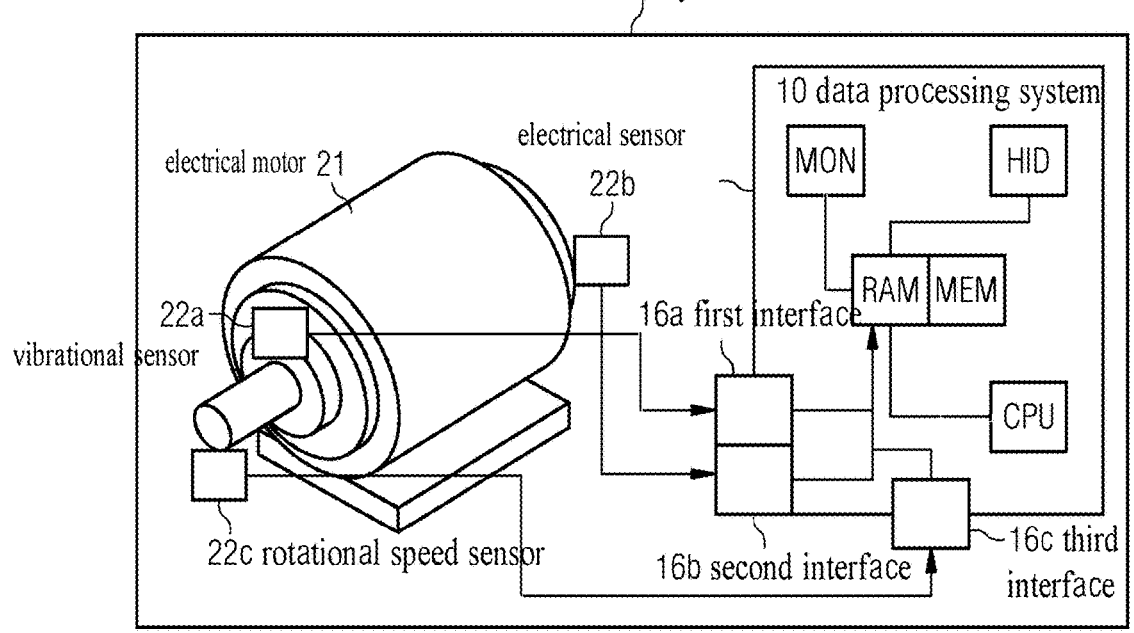
FIG. 5 depicts a schematic view of an embodiment of the system.

In FIG. 5 an embodiment of the system is schematically depicted. The system 20 includes a rotating machine, here an electrical motor 21, a vibrational sensor 22a, an electrical sensor 22b, a rotational speed sensor 22c and the data processing system 10 and as depicted in FIG. 4.

The electrical motor 21 includes a stator and a rotor with a fixedly attached shaft. The rotor with the shaft is pivoted at two points by bearings. The electrical motor 21 converts electrical energy provided as electrical current into kinetic energy in form of a rotation with a certain rotational speed and torque.

The vibrational sensor 22a is arranged near one of the bearings of the electrical motor 21 and communicatively connected to the first interface 16a of the data processing system 10. For converting vibrations into vibrational data the piezo-electric effect or MEMS sensors based on silicon may be used. The vibrational sensor 22a measures vibrations of the one of the two bearings and provides the corresponding vibrational data to the first interface 16a.

The electrical sensor 22b is arranged at the electrical motor 21 and communicatively connected to the second interface 16b of the data processing system 10. The electrical sensor 22b measures the electrical current provided to the electrical motor 21 via a resistor and provides the corresponding electrical data to the second interface 16b.

The rotational speed sensor 22c is arranged at the shaft of the electrical motor 21 and communicatively connected to the third interface 16c of the data processing system 10. The rotational speed sensor 22c measures the current rotational speed of the shaft of the electrical motor 21 and provides the corresponding characteristic rotational speed to the third interface 16c.

Alternative setups use either vibrational sensor 22a or electrical sensor 22b. The rotational speed sensor 22c may be omitted in cases where the rotational speed may be derived from the input data provided by the vibrational sensor 22a and/or the electrical sensor 22b using algorithms or methods like FLL.

The provided vibrational data, electrical data and characteristic rotational speed is forwarded to the processor, for example the RAM 12 and the CPU 11, for executing the steps of the method and as depicted in FIGS. 1 and 2.

Figure 6:
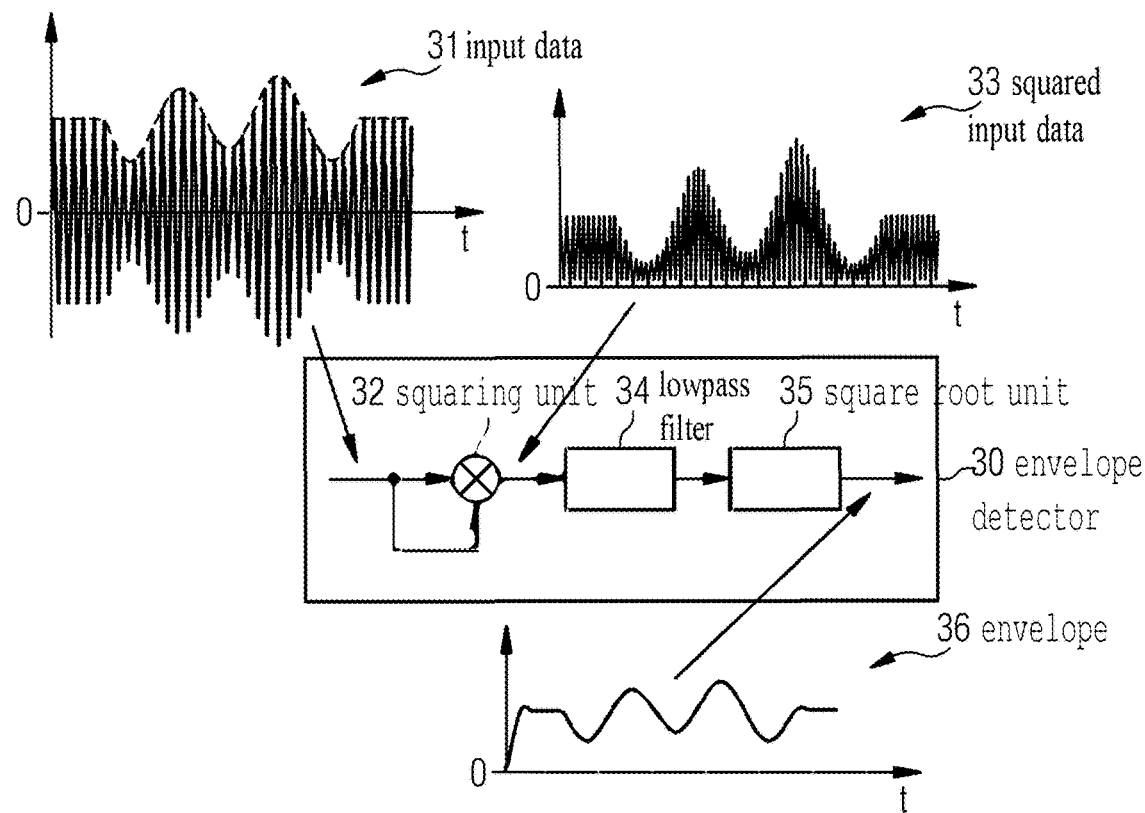
FIG. 6 depicts a schematic block diagram of an asynchronous real square law envelope detector according to an embodiment.

In FIG. 6 an asynchronous real square law envelope detector 30 is schematically depicted. The envelope detector 30 includes a squaring unit 32, a lowpass filter 34 and a square root unit 35.

The current samples of the input data 31, here of the vibrational data and the electrical data, are first squared in the squaring unit 32, that results in the squared input data 33, and then lowpass-filtered by the lowpass filter 34. The output of the low pass filter 34 is provided to the square root unit 35, where the square root is taken. The output is the envelope 36 of the input data, here of the vibrational data and the electrical data.

Figure 7:
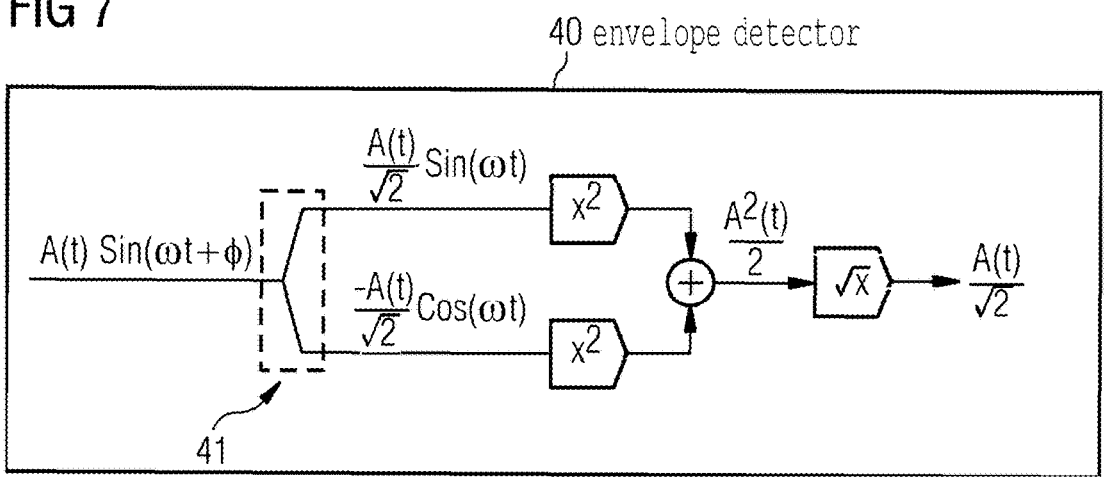
FIG. 7 depicts a schematic block diagram of an asynchronous complex IQ envelope detector according to an embodiment.

In FIG. 7 an asynchronous complex IQ envelope detector 40 is schematically depicted. The envelope detector 40 includes a quadrature power divider 41.

The input data, the vibrational data and the electrical data, is multiplied by sine (In phase—I) and cosine (Quadrature—Q), where ω is the carrier frequency.

In FIG. 8 two diagrams comparing the output of a FFT with the output of the GA are schematically depicted. In the left diagram, a FFT spectrum (crosses) and real-time GA amplitudes for 65 frequencies (dots) are depicted. In the right diagram, a FFT spectrum (solid line) and real-time GA amplitudes for 7 the characteristic rotational speed and seven harmonics (dots) are depicted. Thus it is clear, that the real-time GA only needs the M accumulator variables (plus some m additional supplementary variables for e.g. coefficients, internal storage) to calculate the amplitudes at multiple frequencies under investigation. The few (M+m) variables needed for the GA may be stored in a small memory. Such small memory very cheap compared to large memories needed for the variables for FFT.

Although specific embodiments have been illustrated and described herein, it will be appreciated by those of ordinary skill in the art that a variety of alternate and/or equivalent implementations exist. It should be appreciated that the embodiment or embodiments are only examples, and are not intended to limit the scope, applicability, or configuration in any way. Rather, the foregoing summary and detailed description will provide those skilled in the art with a convenient road map for implementing at least one y embodiment, it being understood that various changes may be made in the function and arrangement of elements described in an embodiment without departing from the scope as set forth in the appended claims and their legal equivalents. Generally, this application is intended to cover any adaptations or variations of the specific embodiments discussed herein.

In the foregoing detailed description, various features are grouped together in one or more examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "including" and "wherein," respectively. Moreover, the terms "first," "second," and "third," etc., are used merely as labels, and are not intended to impose numerical requirements on or to establish a certain ranking of importance of their objects. In the context of the present description and claims the conjunction "or" is to be understood as including ("and/or") and not exclusive ("either . . . or").

The invention claimed is:

1. A computer-implemented method of condition monitoring for rotating machines, the method comprising:
    continuously receiving samples of input data based on at least one physical quantity over time of a rotating machine;
    deriving, in real-time, one or more samples of an envelope of the input data based on the samples of the input data by a rectification followed by an asynchronous complex In-phase Quadrature (IQ) envelope detector, or by a biquad filter approach;
    updating in real-time one or more accumulator variables-based on the one or more the samples of the envelope including a current sample and at least one preceding sample of the one or more samples of the envelope;
    computing in real-time one or more spectral features-based on the one or more accumulator variables and one or more supplemental variables; and
    determining a condition of the rotating machine based on the one or more spectral features;
    wherein the one or more accumulator variables are updated in real-time based on the one or more samples of the envelope including the current sample, a first preceding sample of the envelope, and a second preceding sample of the envelope and wherein the one or more spectral features are computed in real-time by a Goertzel Algorithm;
    wherein the totality of the one or more accumulator variables is sufficient to determine the condition of the rotating machine, and wherein the one or more supplemental variables are temporarily needed for computing the one or more spectral features and the one or more supplemental variables are not based on the received samples of the input data.

2. The method of claim 1 wherein the input data includes vibrational data based on a vibration over time of the rotating machine or electrical data based on an electrical current or voltage over time provided to the rotating machine.

3. The method of claim 2, further comprising:
    continuously receiving at least one characteristic rotational speed of the rotating machine; or
    determining in real-time the at least one characteristic rotational speed of the rotating machine based on the vibrational data by a real-time Frequency Locked Loop method, wherein the one or more accumulator variables are updated based additionally on the rotational speed or harmonics thereof.

4. The method of claim 1, wherein the one or more spectral features include at least one amplitude of at least one first frequency under investigation in the input data, when the one or more accumulator variables include the at least one first frequency under investigation, or at least one amplitude of at least one second frequency under investigation in the envelope, when the one or more accumulator variables include the at least one second frequency under investigation.

5. A computer program comprising instructions which, when the program is executed by a computer, cause the computer to:
    continuously receive samples of input data based on at least one physical quantity over time of a rotating machine;
    deriving, in real-time, one or more samples of an envelope of the input data based on the samples of the input data by a rectification followed by an asynchronous complex In-phase Quadrature (IQ) envelope detector, or by a biquad filter approach;
    update in real-time one or more accumulator variables based on the one or more samples including a current sample and at least one preceding sample of the input data;
    compute in real-time one or more spectral features based on the one or more accumulator variables and one or more supplemental variables; and
    determine a condition of the rotating machine based on the one or more spectral features;
    wherein the one or more accumulator variables are updated in real-time based on the one or more samples including the current sample, a first preceding sample and a second preceding sample of the one or more samples and the one or more spectral features are computed in real-time by a Goertzel Algorithm;
    wherein the totality of the one or more accumulator variables is sufficient to determine the condition of the rotating machine, and wherein the m supplemental variables are temporarily needed for computing the one or more spectral features and the one or more supplemental variables are not based on the received samples of the input data.

6. A system comprising:
a rotating machine;
- at least one sensor configured to measure at least one physical quantity over time of the rotating machine; and
- a data processing system communicatively connected to the at least one sensor, the data processing system comprising:
  - an interface configured to receive samples of input data based on at least one physical quantity over time of the rotating machine; and
  - a processor configured to:
  - continuously receive samples of input data based on at least one physical quantity over time of a rotating machine;
  - derive, in real-time, one or more samples of an envelope of the input data based on the samples of the input data by a rectification followed by an asynchronous complex In-phase Quadrature (IQ) envelope detector, or by a biquad filter approach;
  - update in real-time one or more accumulator variables based on samples including a current sample and at least one preceding sample of the one or more samples;
  - compute in real-time one or more spectral features based on the one or more accumulator variables and one or more supplemental variables; and
  - determine a condition of the rotating machine based on the one or more spectral features;
    - wherein the one or more accumulator variables are updated in real-time based on the one or more samples including the current sample, a first preceding sample, and a second preceding sample of the one or more samples and the one or more spectral features are computed in real-time by a Goertzel Algorithm;
    - wherein the totality of the one or more accumulator variables is sufficient to determine the condition of the rotating machine, and wherein the m supplemental variables are temporarily needed for computing the one or more spectral features and the one or more supplemental variables are not based on the received samples of the input data;
  - wherein the at least sensor is further configured to provide the measured at least one physical quantity as samples of input data to the data processing system.

7. The system of claim 6, wherein the at least one sensor comprises at least one of:
- a vibrational sensor configured to measure a vibration over time of the rotating machine and to provide the measured vibration as samples of vibrational data to the data processing system, or
- an electrical sensor configured to measure an electrical current, voltage, or magnetic field over time provided to the rotating machine and to provide the measured electrical current or voltage as samples of electrical data to the data processing system.

8. The system of claim 7, wherein the processor of the data processing system is further configured to:
- continuously receive at least one characteristic rotational speed of the rotating machine; or
- determine in real-time the at least one characteristic rotational speed of the rotating machine based on the vibrational data by a real-time Frequency Locked Loop method, wherein the one or more accumulator variables are updated based additionally on the rotational speed or harmonics thereof.

* * * * *